United States Patent
Kononchuk et al.

(10) Patent No.: US 10,510,531 B2
(45) Date of Patent: Dec. 17, 2019

(54) METHOD OF FABRICATION OF A SEMICONDUCTOR ELEMENT COMPRISING A HIGHLY RESISTIVE SUBSTRATE

(71) Applicant: Soitec, Bernin (FR)

(72) Inventors: Oleg Kononchuk, Theys (FR); Isabelle Bertrand, Bernin (FR); Luciana Capello, Grenoble (FR); Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/803,447

(22) Filed: Nov. 3, 2017

(65) Prior Publication Data

US 2018/0130698 A1    May 10, 2018

(30) Foreign Application Priority Data

Nov. 4, 2016  (FR) ..................... 16 60682

(51) Int. Cl.
*H01L 21/02*  (2006.01)
*H01L 21/268* (2006.01)
(Continued)

(52) U.S. Cl.
CPC ........ *H01L 21/02337* (2013.01); *C30B 29/06* (2013.01); *H01L 21/02002* (2013.01);
(Continued)

(58) Field of Classification Search
CPC ......... H01L 21/02002; H01L 21/02005; H01L 21/02008; H01L 21/0201; H01L 21/02296;
(Continued)

(56) References Cited

U.S. PATENT DOCUMENTS 4,868,133 A    9/1989  Huber
6,544,656 B1   4/2003  Abe et al.
(Continued)

FOREIGN PATENT DOCUMENTS

FR   2860341 A1   4/2005
FR   2933233 A1   1/2010
(Continued)

OTHER PUBLICATIONS

European Search Report for European Application No. 17198392 dated Mar. 1, 2018, 4 pages.
(Continued)

*Primary Examiner* — Eduardo A Rodela
(74) *Attorney, Agent, or Firm* — TraskBritt

(57) ABSTRACT

A method of fabrication of a semiconductor element includes a step of rapid heat treatment in which a substrate comprising a base having a resistivity greater than 1000 Ohm·cm is exposed to a peak temperature sufficient to deteriorate the resistivity of the base. The step of rapid heat treatment is followed by a curing heat treatment in which the substrate is exposed to a curing temperature between 800° C. and 1250° C. and then cooled at a cooldown rate less than 5° C./second when the curing temperature is between 1250° C. and 1150° C., less than 20° C./second when the curing temperature is between 1150° C. and 1100° C., and less than 50° C./second when the curing temperature is between 1100° C. and 800° C.

17 Claims, 3 Drawing Sheets

(51) Int. Cl.
   *H01L 21/322*    (2006.01)
   *H01L 21/324*    (2006.01)
   *C30B 29/06*     (2006.01)
   *H01L 21/762*    (2006.01)
   *H01L 27/12*     (2006.01)

(52) U.S. Cl.
   CPC .. *H01L 21/02005* (2013.01); *H01L 21/02008* (2013.01); *H01L 21/02123* (2013.01); *H01L 21/02296* (2013.01); *H01L 21/02381* (2013.01); *H01L 21/2686* (2013.01); *H01L 21/324* (2013.01); *H01L 21/3226* (2013.01); *H01L 21/76243* (2013.01); *H01L 21/76251* (2013.01); *H01L 27/1203* (2013.01); *H01L 21/76254* (2013.01)

(58) Field of Classification Search
   CPC .............. H01L 21/324; H01L 21/477; H01L 2224/03848; H01L 2224/11848
   See application file for complete search history.

(56) References Cited

U.S. PATENT DOCUMENTS

| | | |
|---|---|---|
| 7,268,060 B2 | 9/2007 | Ghyselen et al. |
| 2008/0122043 A1 | 5/2008 | Blietz et al. |
| 2008/0283837 A1 | 11/2008 | Tanada |
| 2009/0042375 A1* | 2/2009 | Sawada ................. H01L 21/045 438/522 |
| 2009/0170248 A1* | 7/2009 | Kim ..................... H01L 29/4908 438/166 |
| 2011/0049594 A1* | 3/2011 | Dyer ................. H01L 21/76254 257/296 |
| 2011/0114623 A1* | 5/2011 | Goodman ......... H01L 21/67109 219/385 |
| 2012/0012847 A1 | 1/2012 | Koyama et al. |
| 2014/0340137 A1* | 11/2014 | Keane ................. H03K 17/6872 327/434 |
| 2015/0037967 A1* | 2/2015 | Wilshaw ............. H01L 21/2605 438/558 |
| 2015/0115480 A1 | 4/2015 | Peidous et al. |
| 2016/0276209 A1* | 9/2016 | Usenko ............. H01L 21/76254 |
| 2018/0033681 A1 | 2/2018 | Ishikawa et al. |
| 2018/0182640 A1 | 6/2018 | Broekaart |

FOREIGN PATENT DOCUMENTS

| | | |
|---|---|---|
| FR | 2953640 A1 | 6/2011 |
| FR | 3029682 A1 | 6/2016 |
| FR | 3037438 A1 | 12/2016 |

OTHER PUBLICATIONS

Lederer et al., RF Performance of a Commercial SOI Technology, Transferred Onto a Passivated HR Silicon Substrate, IEEE Transactions on Electron Devices, vol. 55, No. 7, Jul. 2008, pp. 1664-1671.

* cited by examiner

METHOD OF FABRICATION OF A SEMICONDUCTOR ELEMENT COMPRISING A HIGHLY RESISTIVE SUBSTRATE

PRIORITY CLAIM

This application claims the benefit of the filing date of French Patent Application Serial No. 1660682, filed Nov. 4, 2016, for "METHOD OF FABRICATION OF A SEMICONDUCTOR ELEMENT COMPRISING A HIGHLY RESISTIVE SUBSTRATE."

TECHNICAL FIELD

The invention concerns a method of fabrication of a semiconductor element comprising a highly resistive substrate.

BACKGROUND

Integrated devices are usually manufactured on substrates in the form of wafers, which serve primarily as a base for their fabrication. However, the growth in the degree of integration and the expected performance of these devices is producing an increasing link between their performance and the characteristics of the substrate on which they are formed. This is particularly the case with radio frequency (RF) devices, which process signals whose frequency is between about 3 kHz and about 300 GHz, and which find their application in particular in the field of telecommunications (telephony, Wi-Fi, BLUETOOTH®, etc.).

As an example of device/substrate link, the electromagnetic fields resulting from the high frequency signals propagating in the devices penetrate into the depth of the substrate and interact with any charge carriers which may be present there. The result is a useless consumption of a portion of the energy of the signal by insertion loss and possible influences between components by "crosstalk."

Radio frequency devices such as antenna switches and tuners, as well as power amplifiers, can be manufactured on substrates specifically adapted to allow for these phenomena and to improve their performance.

"Highly Resistive Silicon On Insulator" (HR SOI) substrates are also known, comprising, as is shown in FIG. 1a, a base substrate 2 of silicon having a resistivity greater than 1 kOhm·cm, an insulator layer 4 on the base substrate 2, and a surface layer of silicon 5 disposed on the insulator layer. The substrate 1 may likewise comprise a charge trapping layer 3 disposed between the base substrate 2 and the insulator layer 4, as is represented in FIG. 1b. The trapping layer 3 may comprise undoped polycrystalline silicon. The fabrication of this type of substrate is described, for example, in the documents FR 2860341, FR 2933233, FR 2953640, U.S. Patent Publication Application No. 2015/0115480, U.S. Pat. Nos. 7,268,060, and 6,544,656.

The applicant has observed that the application of a rapid heat treatment applied to such an SOI substrate may result in impairment of the radio frequency properties of that substrate. These rapid heat treatments are particularly useful, however, in processing the surface of a substrate during its fabrication. It is also a necessary step in the usual fabrication methods for complementary metal-oxide-semiconductor (CMOS) components, such as for the activation of dopants.

Thus, FIG. 2 illustrates the loss of resistivity observed on a highly resistive SOI substrate after having received a rapid heat treatment. In the graph of FIG. 2, the abscissa axis represents the measurement depth (in microns) in the base substrate 2. This distance is taken from the interface with the insulator layer (this SOI substrate did not have a trapping layer). The ordinate axis represents the resistivity (in Ohm·cm) as found by a measurement of SRP (Spreading Resistance Profiling) type.

In order to perform this measurement, one prepares the substrate by polishing, from one of its planar surfaces, a bevel having a suitable angle to gain access to the desired depth of the substrate. One then applies to the beveled portion of the substrate the ends of two electrodes spaced apart by a fixed distance and forming a segment parallel with the edge of the bevel, and a defined voltage is applied between the two electrodes. One measures the resistance between the two electrodes, then obtains from this measurement the electrical resistivity of the substrate at the measurement depth. By performing this measurement at different distances relative to the edge of the bevel (corresponding to different depths in the substrate), one can then plot a curve of the resistivity profile, representing the resistivity as a function of the depth in the substrate.

In the graph of FIG. 2, a first curve "a" corresponds to the expected resistivity of a base for an SOI substrate before having undergone the rapid heat treatment. This base was specifically manufactured to be a p-type substrate and, hence, have residual positive charge carriers therein.

The second curve "b" of the graph in FIG. 2 corresponds to the SRP measurement performed on this SOI substrate after having undergone a rapid heat treatment, exposing the substrate to a temperature of around 1200° C. for a few seconds before a sudden drop in the temperature at more than 200° C./second.

One observes that the resistivity of the base of the SOI substrate is greatly impaired by this treatment, and it presents a resistivity less than 1000 Ohm·cm at a depth greater than 200 microns from its surface. Furthermore, the charges present in the base 2 were predominantly negatively charged n-type charge carriers after the rapid heat treatment.

The resistivity of the base 2 of the SOI substrate 1, after this substrate has undergone a rapid heat treatment, is not high enough and stable enough in its depth to guarantee the operation according to the specifications required of an RF device formed in this substrate.

BRIEF SUMMARY

One purpose of the present disclosure is to propose a method of fabrication of a semiconductor element involving a step of rapid heat treatment, not having, or else limiting, the variations in resistivity found in the method of the prior art.

In order to accomplish this purpose, in its broadest sense, the present disclosure provides a method of fabrication of a semiconductor element that involves a step of rapid heat treatment exposing a substrate comprising a base having a resistivity greater than 1000 Ohm·cm to a peak temperature able to deteriorate the resistivity of the base. The step of rapid heat treatment is then followed by a curing heat treatment exposing the substrate to a curing temperature between 800° C. and 1250° C. and having a cooldown rate:
  less than 5° C./second when the curing temperature is between 1250° C. and 1150° C.,
  less than 20° C./second when the curing temperature is between 1150° C. and 1100° C., and
  less than 50° C./second when the curing temperature is between 1100° C. and 800° C.

During the curing heat treatment, the concentration of holes in the base is close to the thermodynamic equilibrium concentration. The controlled cooldown of the curing heat treatment allows this situation of near equilibrium to be maintained and the concentration of holes to be reduced. One thus avoids excess freezing or precipitation of these holes at the end of the curing heat treatment, for example, in the form of complexes liable to carry charges that would excessively modify the resistivity of the base.

According to other advantageous and nonlimiting characteristics of the present disclosure, taken alone or in any technically feasible combination:
- the peak temperature is between 1050° C. and 1250° C.;
- the rapid heat treatment and the curing heat treatment are carried out in situ in a rapid thermal annealing system;
- the curing heat treatment is carried out in a system different from the one used for applying the rapid heat treatment;
- the curing heat treatment is carried out in a vertical oven;
- the curing temperature is maintained less than 1050° C. for at least 20 seconds;
- the curing temperature is maintained:
  - less than or equal to 1000° C. for at least 1 minute, or
  - less than or equal to 950° C. for at least 5 minutes, or
  - less than or equal to 900° C. for at least 30 minutes, or
  - less than or equal to 800° C. for at least 3 hours;
- the curing heat treatment is carried out in a neutral, reducing or oxidizing atmosphere;
- the substrate also comprises an insulator layer on the base and a surface layer on the insulator layer;
- the substrate also comprises a charge trapping layer between the base and the insulator layer;
- the charge trapping layer is a layer of polycrystalline silicon;
- the curing heat treatment is preceded by the formation of a protection layer of the substrate;
- the base is made of silicon;
- the semiconductor element is an RF device;
- the semiconductor element is a silicon wafer on insulator having a diameter of 200 or 300 mm.

BRIEF DESCRIPTION OF THE DRAWINGS

The present disclosure will be better understood in light of the following description of nonlimiting embodiments of the disclosure making reference to the enclosed figures in which.

DETAILED DESCRIPTION

In order to simplify the following description, the same references are used for identical elements or those providing the same function in the prior art or in the different embodiments explained for the method.

Figure 3:
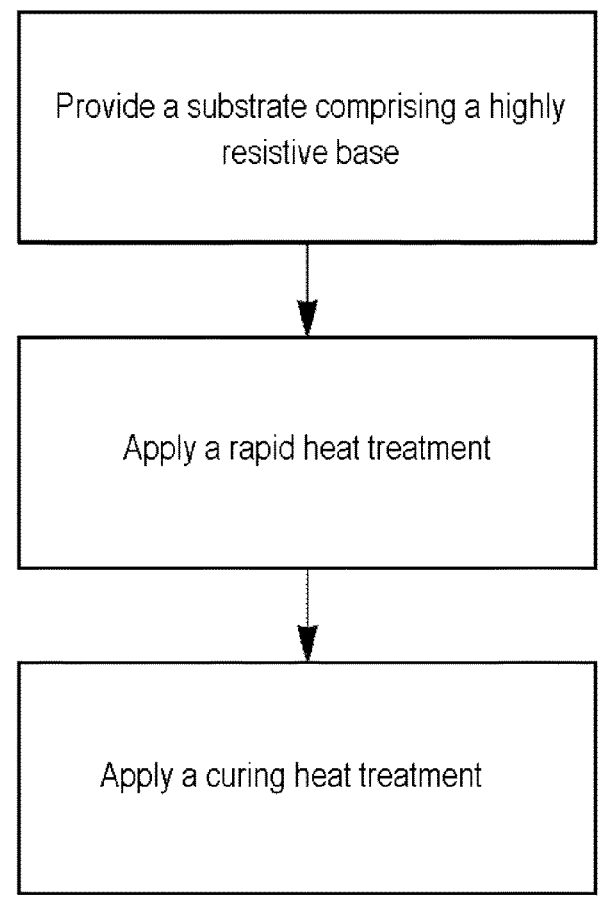
FIG. 3 represents the sequence of steps of a method of fabrication of a semiconductor element according to the present disclosure.

FIG. 3 shows the sequence of steps making up a method of fabrication of a semiconductor element according to the present disclosure.

By "semiconductor elements" is meant either a semiconductor device or substrate, particularly for applications in the field of RF. Thus, the present disclosure is applicable to the fabrication of one or the other of these elements.

During a first step, one provides a substrate 1 having a highly resistive base 2, that is, with a resistivity greater than 1000 Ohm·cm. Preferably, the base 2 has this highly resistive quality for its entire thickness. This characteristic can be measured by the SRP technique explained in the introduction of this application.

The base 2 may be made at least partly of silicon obtained, for example, by the Czochralski (Cz) method. The base 2 may thus correspond to a p-type silicon substrate having a low quantity of interstitial oxygen (denoted as "low Oi") of between 6 ppm and 10 ppm. It may also be a silicon substrate having a high quantity of interstitial oxygen (denoted as "high Oi") greater than 26 ppm, prior to precipitation.

In some embodiments, the substrate 1 may be a silicon-on-insulator (SOI) substrate having a surface layer of silicon 5, an insulator layer 4 comprising, for example, silicon oxide, and a silicon base 2.

The substrate 1 may also have a charge trapping layer 3 positioned between the insulator layer 4 and the base 2 in some embodiments.

As is taught in the documents forming the prior art and discussed in the Background, the substrate 1 can be made in many ways. It may be fabricated by application of the SMART CUT® technology, whereby a layer of oxidized silicon destined to form the surface layer of silicon 5 and the insulator layer 4 of the substrate 1 is transferred to a base 2, which may optionally include the trapping layer 3. This transfer step is traditionally followed by a finishing sequence of the substrate 1 to provide the substrate 1 with the required properties, especially with respect to the properties and characteristics of the exposed major surface of the substrate 1.

Conventionally, the substrate 1 may be present in the form of a circular wafer having a diameter of 200 mm, 300 mm, or even 450 mm, for example.

The surface layer 5 may have a thickness between 10 nm and 10 microns. The insulator layer 4 may comprise silicon dioxide, and may have a thickness between 10 nm and 50 microns.

The trapping layer 3, generally speaking, may be composed of a non-crystalline semiconductor layer having structural defects such as dislocations, grain boundaries, amorphous zones, interstices, inclusions, pores, etc. These structural defects form traps for the charges likely circulating in the material, for example, in the area of incomplete or dangling chemical bonds. One thus prevents the conduction in the trapping layer, which consequently has a high electrical resistivity.

The trapping layer 3 may comprise a layer of polycrystalline silicon, for example. The trapping layer 3 may have a thickness between 1 μm and 3 μm, although other thicknesses above or below this range may also be possible.

The surface layer 5, the insulator layer 4 and the trapping layer 3 may have compositions and thicknesses other than those mentioned herein, and they may be chosen or dictated as needed and by the context of the application in which the substrate 1 is to be used.

Figures 1A, 1B:
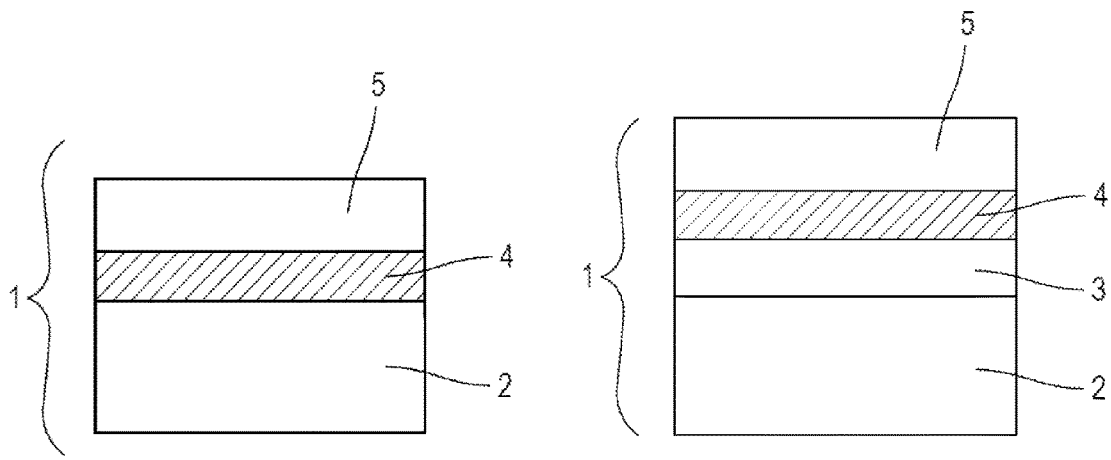
FIGS. 1a and 1b represent highly resistive SOI substrates of the prior art.
Figure 2:
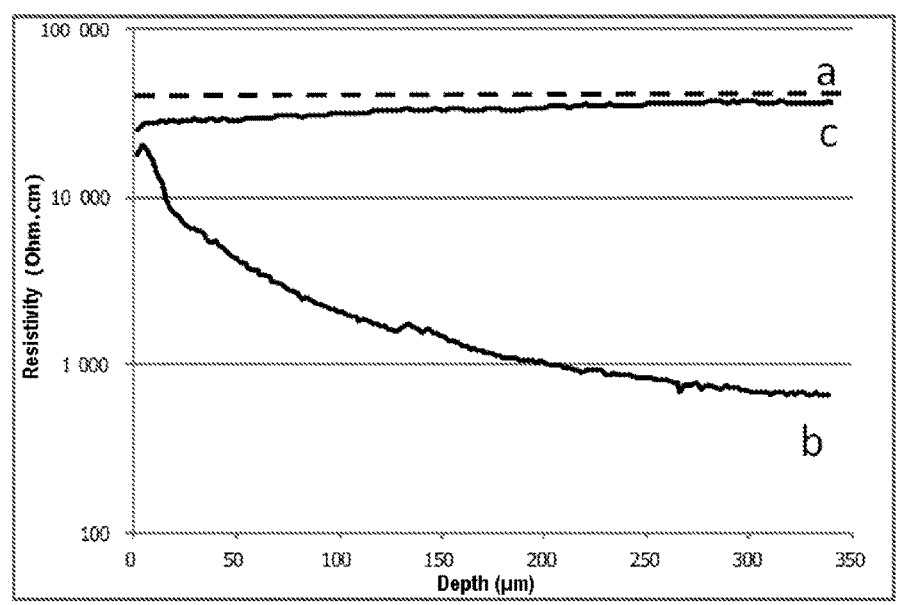
FIG. 2 is a graph illustrating the loss of resistivity observed on a highly resistive SOI substrate after having received a rapid heat treatment.

In a following step of a method according to the present disclosure, and still referring to FIG. 2, the substrate 1 comprising the base 2 is exposed to a peak temperature. The peak temperature is the maximum temperature to which the substrate 1 is exposed during a rapid heat treatment step. This step may be part of the finishing sequence of the substrate 1 during its fabrication. It may likewise correspond to a step of fabrication of a semiconductor device, such as a step of activation of dopants.

By "rapid heat treatment" is meant a step during which the substrate 1 is exposed to a treatment atmosphere for a maximum time of two minutes at a treatment plateau temperature. The treatment plateau temperature is typically between 1125 degrees Celsius and 1250 degrees Celsius and corresponds to the peak temperature to which the substrate 1 is exposed. The phases of rise and fall to reach the plateau temperature are performed at a high thermal gradient of more than 60° C./second, which makes it possible to limit the total duration of the treatment.

The duration of the treatment plateau, depending on the chosen rapid heat treatment system, may be very short, on the order of several microseconds in a flash annealing system, or may extend to a duration of 15 to 45 seconds in a rapid annealing oven.

The treatment atmosphere depends on the purpose of this treatment. For example, it may be a neutral, reducing, or oxidizing atmosphere.

Figure 4:
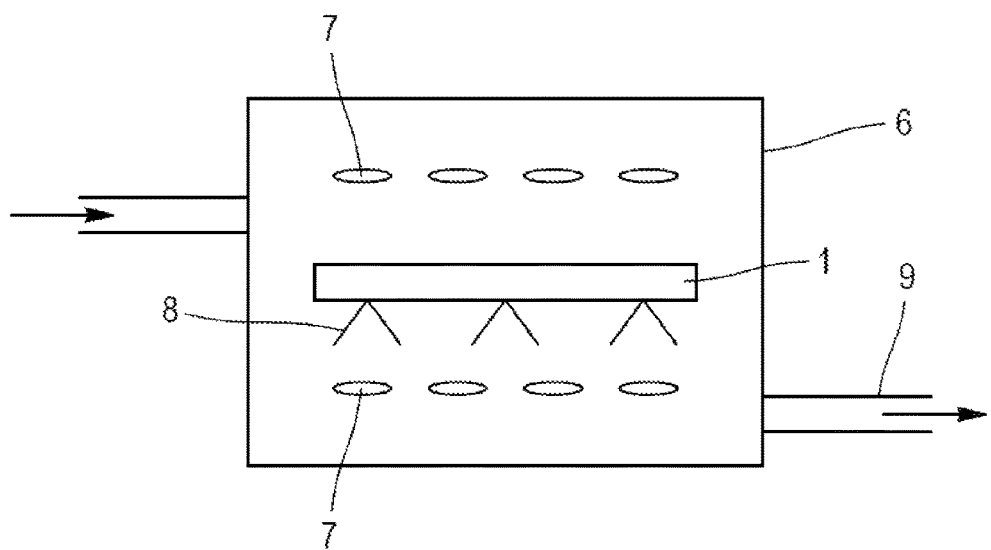
FIG. 4 represents a known configuration of a rapid thermal annealing system.

In order to apply this rapid heat treatment, there is known, for example, and as is represented schematically in FIG. 4, a rapid thermal annealing system comprising a quartz chamber 6 to receive a substrate to be treated. The treatment is done with the aid of heating lamps 7 disposed below and above the substrate 1. During the treatment, the substrate is maintained horizontal in the chamber 6 on a base formed by three points 8. The atmosphere of the chamber may be controlled by introducing a chosen gas into the chamber, while evacuating the atmosphere from the chamber by way of a controlled opening exhaust 9.

The rapid heat treatment is applied using this system by providing electric power to the lamps 7 in order to heat the substrate by radiation up to a predetermined temperature, for example, between 1150° C. and 1250° C. The temperature increase of the substrate is very rapid, on the order of 60° C. per second or more, although it may require 10 to 20 seconds in order to reach the plateau temperature. The heat treatment is carried out at this plateau temperature for a length of time, which may be between 30 seconds and about two minutes in this system. At the end of this time, the electric power furnished to the lamps 7 is cut off and the temperature of the substrate drops very quickly, likewise on the order of 60° C. per second. One must generally count on 20 to 30 seconds to achieve the cooldown of the substrate and enable it to be extracted from the chamber. A typical temperature profile obtained in this system is reproduced for example in FIG. 5. It will be noted that the pyrometer with which the chamber 6 is equipped, which enables the temperature measurement, is only active for temperature values greater than around 600° C. or 700° C., which explains the truncated shape of the plot in FIG. 5.

The rapid heat treatment can also be applied by a laser annealing system, or a flash annealing system.

At the end of this rapid heat treatment, and as has been mentioned in the introduction of this application, the resistivity of the substrate 1 is likely to be deteriorated. Consequently, one cannot guarantee that a semiconductor device formed in/on the substrate 1 will function according to the required specifications.

Without tying the present disclosure to any physical interpretation of these observations and of the phenomena which might be at play, it appears that the base 2 is particularly sensitive to the rapid heat treatment.

The analyses performed by the applicant tend to show that a major concentration of holes is formed in the base when the peak temperature is between 1050° C. and 1250° C. During the cooldown, and in particular when the temperature becomes less than 1050° C., these holes are liable to combine with the interstitial oxygen of the base to form, especially when the concentration of holes exceeds the concentration of thermodynamic equilibrium, stable hole/oxygen complexes in the body of the base 2. These complexes are known by the term "vacancy-oxygen complexes" or "VO complexes."

The concentration of holes, at thermodynamic equilibrium, increases with the temperature. For example, this concentration may reach a concentration of 3 to $5\times10^{12}$ cm$^{-3}$ at 1200° C. During the rapid cooldown of the substrate 1, and in the absence of any particular precautions, these holes are frozen in the base 2 by combining with the interstitial oxygen. This general mechanism has already been reported in the technical literature of the field. However, and in a particularly original manner, the applicant has established that these complexes are not electrically neutral, but may carry a negative charge. According to the analysis carried out in the context of the present invention, the charges carried by the hole/oxygen complexes and created at the end of the rapid heat treatment result in the modification of the resistivity discussed in the introduction of the application. It will also be understood that the generating of negative charges in a large concentration may result in the transforming of the conductivity of the base from p-type to n-type.

The present disclosure takes advantage of these novel results to propose an improved method of fabrication of a semiconductor element.

Referring to FIG. 2, in accordance with the present disclosure, the rapid heat treatment step is followed by a curing heat treatment of the substrate 1 to restore or at least partly prevent the loss of resistivity.

According to the disclosure, the curing heat treatment exposes the substrate 1 to a curing temperature between 800° C. and 1250° C. and has a rate of cooldown:
  less than 5° C./second when the curing temperature is between 1250° C. and 1150° C.,
  less than 20° C./second when the curing temperature is between 1150° C. and 1100° C., and
  less than 50° C./second when the curing temperature is between 1100° C. and 800° C.

In the temperature range between 800° C. and 1250° C., it is possible to dissociate the oxygen/hole complexes, which thus lose their stability. Moreover, by controlling the cooldown of the substrate 1 (and thus the base 2), one progressively reduces the concentration of holes to the thermodynamic equilibrium concentration thereof, which decreases with the temperature. One thus avoids freezing these holes in an excessive concentration in the form of hole/oxygen complexes.

The curing heat treatment atmosphere may be composed of a neutral gas, such as argon, a reducing gas such as hydrogen, or even a mixture of these two types of gas. It may also be oxygen.

According to a first embodiment, the curing heat treatment can be carried out in a system other than that used for the rapid heat treatment.

This embodiment is particularly recommended when it is not possible to modify the conditions of the rapid heat treatment to prevent or limit an excessive concentration of hole/oxygen complexes. This is particularly the case when the rapid heat treatment is intended to activate dopants previously introduced in the surface layer 5 of the substrate 1. It is known in this case that it is important to limit the heat treatment to only what is necessary in order to avoid the diffusion of these dopants, which does not always allow controlling of the cooldown from this rapid heat treatment in the recommended range.

In order to cure the modification of resistivity of the base, which then occurs in this case, one may apply to the substrate 1, for example, in a traditional vertical oven, a curing heat treatment having a curing temperature less than or equal to 1050° C. for at least 20 seconds. This heat treatment has a cooldown less than 50° C./second in order to remain compatible with the general conditions of the heat treatment enabling the curing of the base, as explained above.

By not going beyond the threshold temperature of 1050° C., one avoids generating new holes in the base 2 and creating new stable hole/oxygen complexes liable to impair the resistivity of the base 2. As an example, the curing temperature of the curing heat treatment can be maintained less than or equal to 1000° C. for at least 1 minute, or less than or equal to 950° C. for at least 5 minutes, or less than or equal to 900° C. for at least 30 minutes, or less than or equal to 800° C. for at least 3 hours in order to restore at least in part the resistivity of the base 2. Whatever the temperature chosen, between 1050° C. and 800° C., this is maintained long enough in this range to reduce the hole concentration, by bringing the concentration close to the thermodynamic equilibrium concentration at the chosen temperature.

Figure 5:
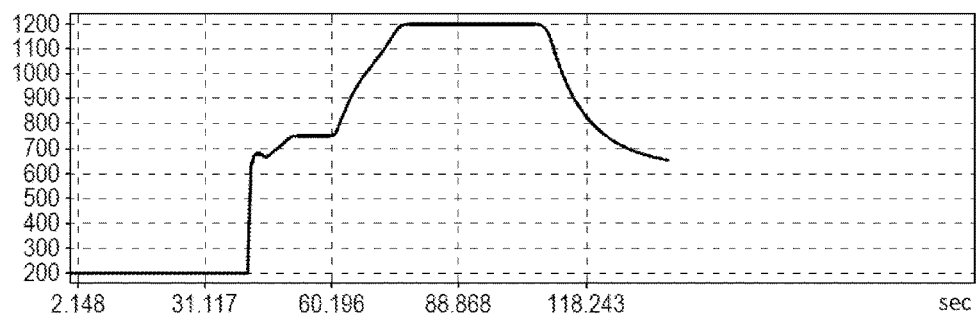
FIG. 5 reproduces the temperature profile of a rapid heat treatment.

On an SOI substrate similar to the one having undergone the measurements shown on the curves a and b of FIG. 2, and after this substrate has undergone a rapid heat treatment whose temperature profile is comparable to that shown in FIG. 5, a heat treatment at 900° C. was applied for more than one hour. This heat treatment was preceded by the oxidation of the surface layer of the SOI substrate. At the end of this curing heat treatment, SRP measurements were taken, of which the curve of resistivity denoted by letter c in FIG. 2 is the result. One notes that the resistivity of the base is relatively constant and of a magnitude close to that of the original resistivity represented by curve a. This finding shows the effect and the effectiveness of the proposed curing annealing.

According to a second embodiment of the present disclosure, the rapid heat treatment and the curing heat treatment are performed in situ, for example, in a rapid thermal annealing system.

According to a first variant of this embodiment, the curing heat treatment is integrated in the rapid heat treatment. By controlling the electrical energy provided to the lamps 7 of the chamber 6 of the rapid thermal annealing system at the end of the temperature plateau, corresponding to the peak temperature, the curing heat treatment can be established by controlling the temperature drop by a thermal gradient less than 5° C./second when the curing temperature is between 1250° C. and 1150° C., less than 20° C./second when the curing temperature is between 1150° C. and 1100° C., and less than 50° C./second when the curing temperature is between 1100° C. and 800° C.

Figure 6:
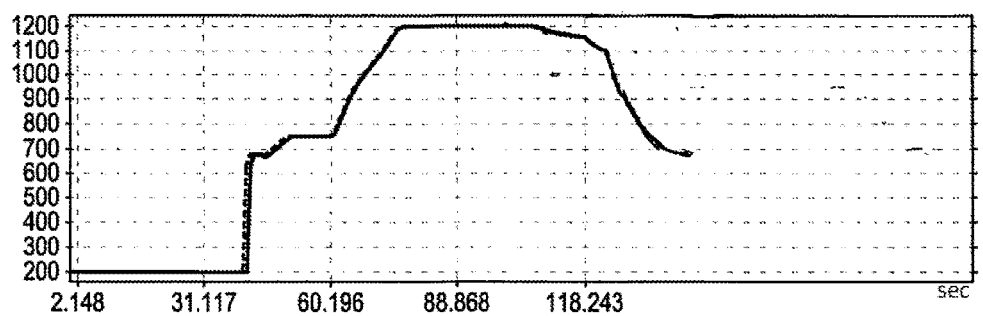
FIG. 6 shows an example of a curing heat treatment according to one embodiment of the present disclosure.

This slower cooldown compared to the rapid heat treatment of the prior art is thus very easily achieved by adjusting the electric power provided to the lamps 7 during this cooldown phase. FIG. 6 shows a rapid heat treatment integrating, after the temperature plateau, the curing heat treatment according to the present disclosure.

According to another variant, the curing heat treatment is applied to the substrate 1 in the rapid thermal annealing system, separately from the rapid heat treatment. For example, the curing heat treatment may be applied to the substrate 1 at the end of the rapid heat treatment, and once the treatment temperature has returned to a temperature near ambient temperature.

This variant allows, for example, applying the rapid heat treatment in a first atmosphere (for example, neutral or reducing) and then applying the curing heat treatment in a second atmosphere, different from the first (for example, oxidizing).

Figure 7:
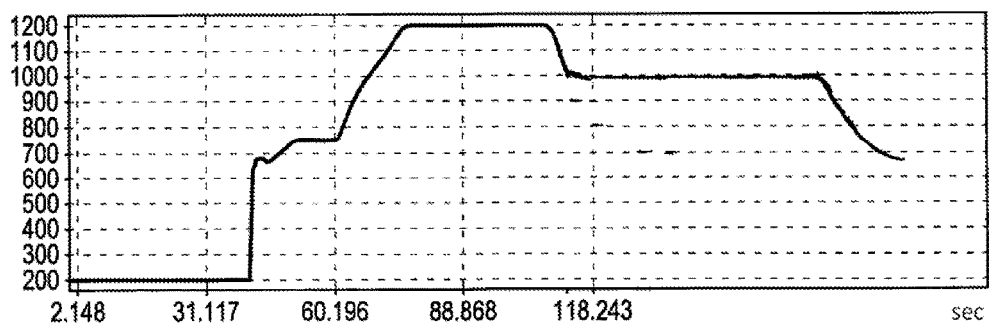
FIG. 7 shows an example of a curing heat treatment according to another embodiment of the present disclosure.

According to yet another variant, the curing heat treatment is applied to the substrate 1 in the rapid annealing system, after the rapid heat treatment, but without directly following the temperature plateau. One example of such an embodiment is represented in FIG. 7. In this example, the plateau at 1200° C. is followed by a rapid cooldown, that is, of at least 60° C. per second, down to the temperature of 1000° C., which does not contribute to the curing heat treatment. The latter is comprised, in the example of FIG. 7, of a heat treatment at 1000° C. for 60 seconds, followed by a cooldown to ambient temperature at less than 50° C. per second.

Regardless of the embodiment of the curing heat treatment, the resistivity of the base 2, at the end of this treatment, may be modified little, if at all. In any case, the possible modification of the resistivity of the base 2 after the curing heat treatment is less than what would have been observed in the absence of this curing heat treatment.

Of course, the present disclosure is not limited to the embodiments described and one can make variant embodiments thereto without leaving the scope of the invention as defined by the claims.

Thus, the curing heat treatment may be preceded by or include a phase of oxidation in order to protect the surface of the substrate 1 from the treatment atmosphere. The layer of oxide formed can then be eliminated at the end of the step of curing heat treatment by a simple chemical etching. An oxidized surface limits the hole formation during a rapid heat treatment, by recombination effect.

The disclosure is in no way limited to the application of a curing heat treatment to a substrate of SOI type. It may be applied to any type of substrate comprising a base of highly resistive silicon. The substrate may be composed of such a base. In other words, the substrate may be a massive wafer of highly resistive silicon. The substrate may likewise comprise additional layers formed on or in the base. It may be provided with completely or partly fabricated semiconductor devices. When it involves a substrate of SOI type, the insulator layer and the surface layer may be continuous or they may have patterns or trenches.

According to the present disclosure, it may be advantageous to provide a base having a very low quantity of interstitial oxygen in order to limit the formation of hole/oxygen complexes, and further reduce the modifications in resistivity of the base. Advantageously, the interstitial oxygen concentration in the base 2 may be between 5 and 15 old ppma (according to standard ASTM (1979)), which makes an acceptable compromise between the mechanical strength of the substrate (to which the interstitial oxygen contributes) and the residual variations in resistivity of the base 2.

One will also choose, when such is possible, to limit the duration of the rapid heat treatment, especially in the temperature range between 1050° C. and 1250° C., in order to limit the creation of holes, these holes being the cause of the phenomenon reported.

What is claimed is:

1. A method of fabrication of a semiconductor element, the method comprising:
    applying a step of rapid heat treatment exposing a substrate comprising a base having a resistivity greater than 1000 Ohm·cm and less than 100,000 Ohm·cm, an insulator layer on the base and a surface layer on the insulator layer, to a peak temperature sufficient to deteriorate the resistivity of the base, the base consisting essentially of silicon, silicon with interstitial oxygen, p-type silicon, or p-type silicon with interstitial oxygen; and
    after applying the step of rapid heat treatment, applying a curing heat treatment exposing the substrate to a curing temperature between 800° C. and 1250° C. and generating a concentration of holes and, thereafter, cooling the substrate at a cool down rate:
        less than 5° C./second when the curing temperature is between 1250° C. and 1150° C.,
        less than 20° C./second when the curing temperature is between 1150° C. and 1100° C.; and
        less than 50° C./second when the curing temperature is between 1100° C. and 800° C.; and
    while cooling the substrate, reducing the concentration of holes to their thermodynamic equilibrium concentration and avoiding freezing the holes in an excessive concentration in the form of hole/oxygen complexes having a negative charge.

2. The method of fabrication according to claim 1, wherein the peak temperature is between 1050° C. and 1250° C.

3. The method of fabrication according to claim 2, wherein the rapid heat treatment and the curing heat treatment are carried out in situ in a rapid thermal annealing system.

4. The method of fabrication according to claim 2, wherein the curing heat treatment is carried out in a system different from the one used for applying the rapid heat treatment.

5. The method of fabrication according to claim 4, wherein the curing heat treatment is carried out in a vertical oven.

6. The method of fabrication according to claim 4, wherein the curing temperature is maintained less than 1050° C. for at least 20 seconds.

7. The method of fabrication according to claim 6, wherein the curing temperature is maintained:
    less than or equal to 1000° C. for at least 1 minute, or
    less than or equal to 950° C. for at least 5 minutes, or
    less than or equal to 900° C. for at least 30 minutes, or
    less than or equal to 800° C. for at least 3 hours.

8. The method of fabrication according to claim 4, wherein the curing heat treatment is carried out in a neutral, reducing or oxidizing atmosphere.

9. The method of fabrication according to claim 1, wherein the substrate further comprises a charge trapping layer between the base and the insulator layer.

10. The method of fabrication according to claim 9, wherein the charge trapping layer is a layer of polycrystalline silicon.

11. The method of fabrication according to claim 1, wherein the curing heat treatment is preceded by the formation of a protection layer on the substrate.

12. The method of fabrication according to claim 1, wherein the semiconductor element comprises a radio frequency (RF) device.

13. The method of fabrication according to claim 1, wherein the semiconductor element is a silicon-on-insulator (SOI) wafer having a diameter of 200 mm or 300 mm.

14. The method of fabrication according to claim 1, wherein the rapid heat treatment and the curing heat treatment are carried out in situ in a rapid thermal annealing system.

15. The method of fabrication according to claim 1, wherein the curing heat treatment is carried out in a system different from a system used for applying the rapid heat treatment.

16. The method of fabrication according to claim 1, wherein the curing temperature is maintained:
    less than or equal to 1000° C. for at least 1 minute, or
    less than or equal to 950° C. for at least 5 minutes, or
    less than or equal to 900° C. for at least 30 minutes, or
    less than or equal to 800° C. for at least 3 hours.

17. The method of fabrication according to claim 1, wherein the curing heat treatment is carried out in a neutral atmosphere.

* * * * *